United States Patent [19]
Tu et al.

[11] Patent Number: 6,104,320
[45] Date of Patent: Aug. 15, 2000

[54] INPUT DETECTION CIRCUIT FOR A MATRIX KEYBOARD

[75] Inventors: Shih-Ping Tu, Miou-Li; Tyng-Yuan Luh, Kao-Shung, both of Taiwan

[73] Assignee: Holtek Semiconductor Inc., Taiwan

[21] Appl. No.: 09/012,527

[22] Filed: Jan. 23, 1998

[51] Int. Cl.[7] .................................................. G08B 7/06
[52] U.S. Cl. .............................. 341/26; 341/33; 341/20; 370/368
[58] Field of Search .................................. 341/26, 22, 33, 341/20; 340/825.79; 329/368; 400/479.1

[56] References Cited

U.S. PATENT DOCUMENTS

| | | | |
|---|---|---|---|
| 3,696,908 | 10/1972 | Gluch | 400/479.1 |
| 3,797,630 | 3/1974 | Zilkha | 400/479.1 |
| 4,007,459 | 2/1977 | Hagelbarger | 341/26 |
| 4,412,209 | 10/1983 | Frame | 341/26 |
| 4,415,781 | 11/1983 | Frame | 200/5 A |
| 4,772,874 | 9/1988 | Hasegawa | 341/26 |
| 5,101,429 | 3/1992 | Geboers | 379/368 |
| 5,349,344 | 9/1994 | Head | 341/26 |
| 5,450,080 | 9/1995 | Irwin | 341/26 |
| 5,508,700 | 4/1996 | Taylor | 341/33 |
| 5,956,795 | 1/1999 | Arnold | 341/26 |

Primary Examiner—Michael Horabik
Assistant Examiner—Albert K. Wong
Attorney, Agent, or Firm—Raymond Sun

[57] ABSTRACT

An input detection circuit includes a matrix of keys formed by the intersection of a plurality of columns of keys and a plurality of rows of keys, with a crossover capacitor connected across the intersecting row and column of one of the keys. The input detection circuit further includes circuits for generating a difference in voltage potential across the capacitor, and circuits responsive to the difference in voltage potential across the capacitor for generating a signal representative of the presence of the capacitor. By knowing which keys have been connected with a crossover capacitor, the processor of the telephone will also know what scan options have been programmed.

25 Claims, 7 Drawing Sheets

| KEY PRESSED | RL(1:4) | CL(1:4) |
|---|---|---|
| K11 | '0111' | '0111' |
| K12 | '1011' | '0111' |
| K13 | '1101' | '0111' |
| K14 | '1110' | '0111' |
| K21 | '0111' | '1011' |
| K22 | '1011' | '1011' |
| K23 | '1101' | '1011' |
| K24 | '1110' | '1011' |
| K31 | '0111' | '1101' |
| K32 | '1011' | '1101' |
| K33 | '1101' | '1101' |
| K34 | '1110' | '1101' |
| K41 | '0111' | '1110' |
| K42 | '1011' | '1110' |
| K43 | '1101' | '1110' |
| K44 | '1110' | '1110' |

FIG.10

INPUT DETECTION CIRCUIT FOR A MATRIX KEYBOARD

BACKGROUND OF THE INVENTION

1. Field of the Invention

The present invention relates to input detection circuits, and in particular, to an input detection circuit for use with a matrix keypad or keyboard of a touch tone telephone.

2. Description of the Prior Art

A conventional telephone keypad that is used in a touch tone mode is configured in the form of a matrix having a plurality of rows R1–R4 and a plurality of columns C1–C4 of matrix pins. Referring to FIG. 1, resistors connect certain rows and columns to allow the selection of various dialing specifications or options. The conventional keypad of FIG. 1 operates in the following manner. When the user picks up the telephone handset or receiver, the circuit will enter the "scan option" mode in which it scans or detects the selected options represented by the specific resistor connections. These options can include: (1) the blockage of calls made outside a certain area code, (2) operation of the telephone in a pulse dial mode, and (3) the requirement to dial a "9" to get an outside line, among others. The scan option mode is performed very quickly, typically within 20 msec. After the scan option mode has been completed, the telephone enters the "press key" mode in which it waits for the user to press certain keys which the circuit will recognize as representing the telephone number to be dialed.

Unfortunately, the conventional keypad suffers from several disadvantages. First, if a key is pressed when the options are being scanned (i.e., during the scan option mode), errors may result. For example, if a user presses a key before lifting the handset, the circuit may detect an unknown option, or may override a previously programmed option. Second, since the conventional keypad circuit utilizes resistors to connect rows and columns, during stand-by time (i.e., the waiting time before and between key presses), the differences in the potential of the resistors will cause current to pass through the resistors, resulting in power dissipation.

Thus, there still remains a need for an input detection circuit for a matrix keypad which overcomes the drawbacks of the prior art circuits, which provides an improved input detection circuit, which prevents errors during the scanning of options, and which minimizes the loss of power during use.

SUMMARY OF THE DISCLOSURE

In order to accomplish the objects of the present invention, there is provided an input detection circuit for a matrix keypad which relies on the characteristics of capacitance for scanning selected options. In particular, the present invention relies upon the principle that the voltage difference across two terminals of a capacitor does not change instantly, and further relies on the charging and discharging characteristics of the capacitance. In addition, by taking advantage of the switchover mode of a switch, different reference potentials are created which, together with setting appropriate voltage conversion points, allow for the condition of a circuit connection between two input/output ports to be determined.

The present invention applies the above-described principles by connecting a capacitor across certain keys. The capacitor generates a difference in voltage potential across its terminals which is utilized to detect the presence of the capacitor. The signal generated as a result of the difference in voltage potential is processed to determine which keys have been connected with a crossover capacitor. By knowing which keys have been connected with a crossover capacitor, the processor of the telephone will also know what scan options have been programmed.

The input detection circuit of the present invention includes a matrix of keys formed by the intersection of a plurality of columns of keys and a plurality of rows of keys, with a capacitor connected across the intersecting row and column of one of the keys. The input detection circuit further includes circuits for generating a difference in voltage potential across the capacitor, and circuits responsive to the difference in voltage potential across the capacitor for generating a signal representative of the presence of the capacitor. The signal that is representative of the presence of the capacitor may further represent a programmable option.

According to one embodiment of the present invention, the circuits for generating a difference in voltage potential across the capacitor includes a bias section circuit coupled to a positive terminal of the capacitor, and a scan section circuit coupled to the negative terminal of the capacitor. The bias section circuit can include a first switch coupled to the positive terminal, a first voltage source coupled to the positive terminal via the first switch, a second switch coupled to the positive terminal, and a second voltage source coupled to the positive terminal via the second switch. The scan section circuit can include a first switch coupled to the negative terminal, a first output indicative of whether a key has been pressed, and a second output which is the signal representative of the presence of the capacitor. The circuits for generating a signal representative of the presence of the capacitor can further include a latch coupled to the first and second outputs to prevent the transmission of the second output if the first output received by the latch indicates that a key has been pressed.

According to another embodiment of the present invention, a switch can be coupled to the capacitor between the intersecting row and column to allow the user to select or to disable the option represented by the capacitor.

BRIEF DESCRIPTION OF THE DRAWINGS

FIG. 10 is a chart which illustrates the output signals of RLm and CLn when particular keys have been pressed.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known circuits and components are omitted so as to not obscure the description of the present invention with unnecessary detail.

The present invention provides an input detection circuit for a matrix keypad which relies on the characteristics of capacitance for scanning selected options. In particular, the present invention relies upon the principle that the voltage difference across two terminals of a capacitor does not change instantly, and further relies on the charging and discharging characteristics of the capacitance. In addition, by taking advantage of the switchover mode of a switch, different reference potentials are created which, together with setting appropriate voltage conversion points, allow for the condition of a circuit connection between two input/output ports to be determined.

The present invention applies the above-described principles by connecting a capacitor across certain keys. The capacitor generates a difference in voltage potential across its terminals which is utilized to detect the presence of the capacitor. The signal generated as a result of the difference in voltage potential is processed to determine which keys have been connected with a crossover capacitor. By knowing which keys have been connected with a crossover capacitor, the processor of the telephone will also know what scan options have been programmed.

Figure 1:
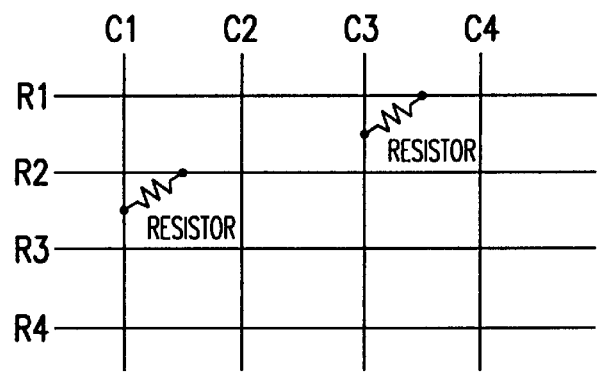
FIG. 1 is a simplified circuit diagram of a conventional circuit that is used for a conventional telephone matrix keypad.
Figure 2:
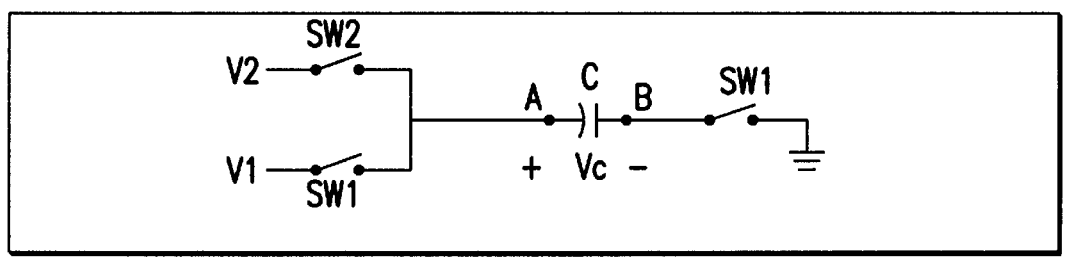
FIG. 2 is a simplified circuit diagram illustrating the basic principles of the present invention.
Figure 3:
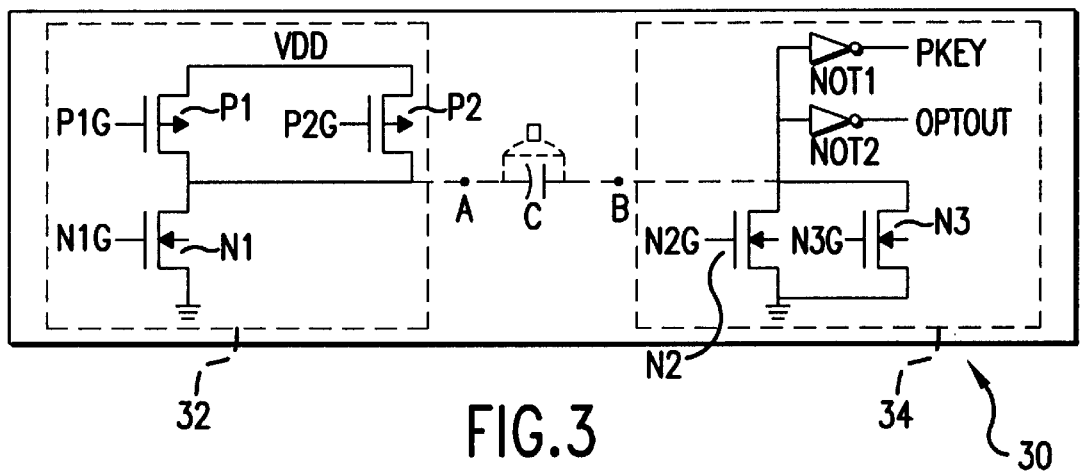
FIG. 3 is a simplified circuit diagram of one embodiment of the present invention utilizing the principles of FIG. 2.
Figure 4:
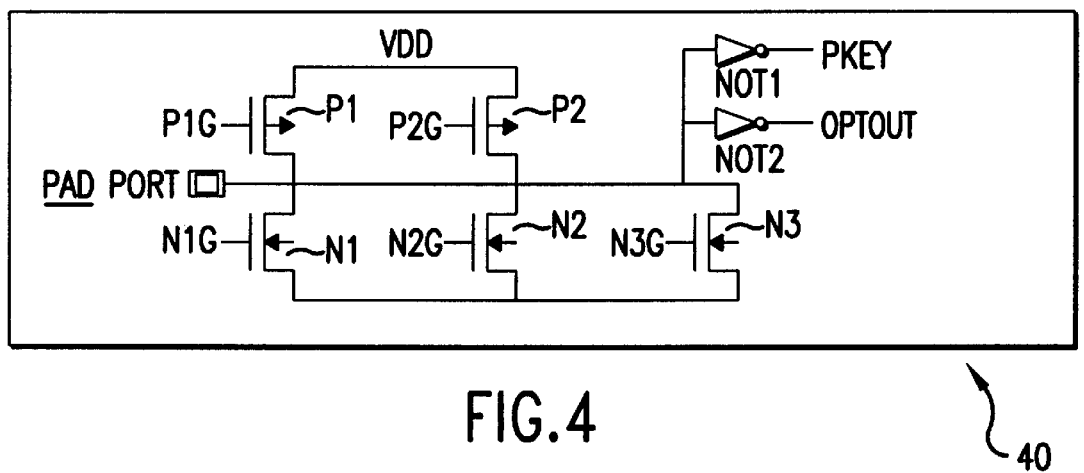
FIG. 4 is a simplified circuit diagram showing how the circuit of FIG. 3 can be modified to operate in both the bias mode and the scan mode.
Figure 5:
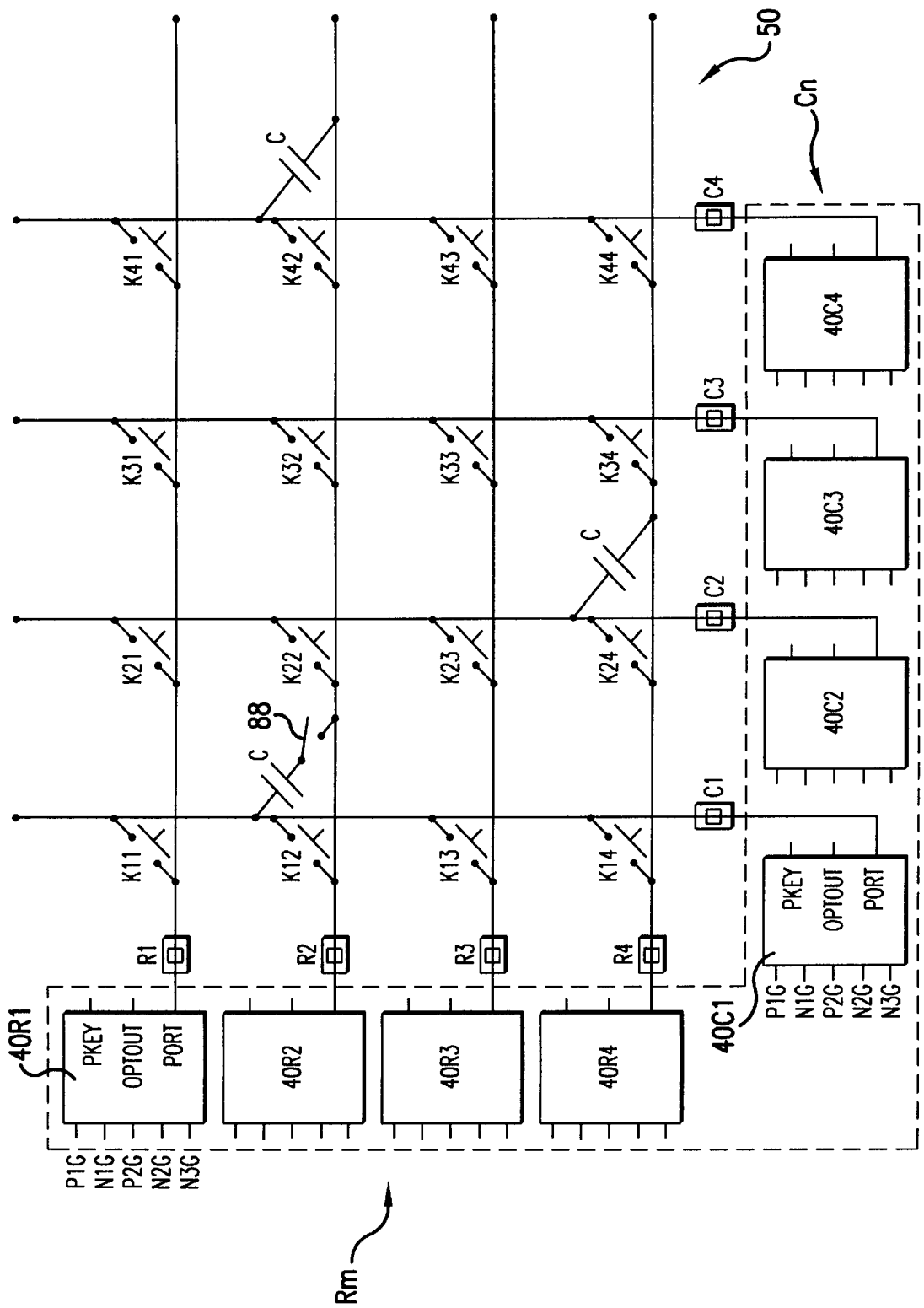
FIG. 5 is a simplified circuit diagram illustrating the use of the circuit of FIG. 4 in connection with a keypad matrix according to the present invention.
Figure 6:
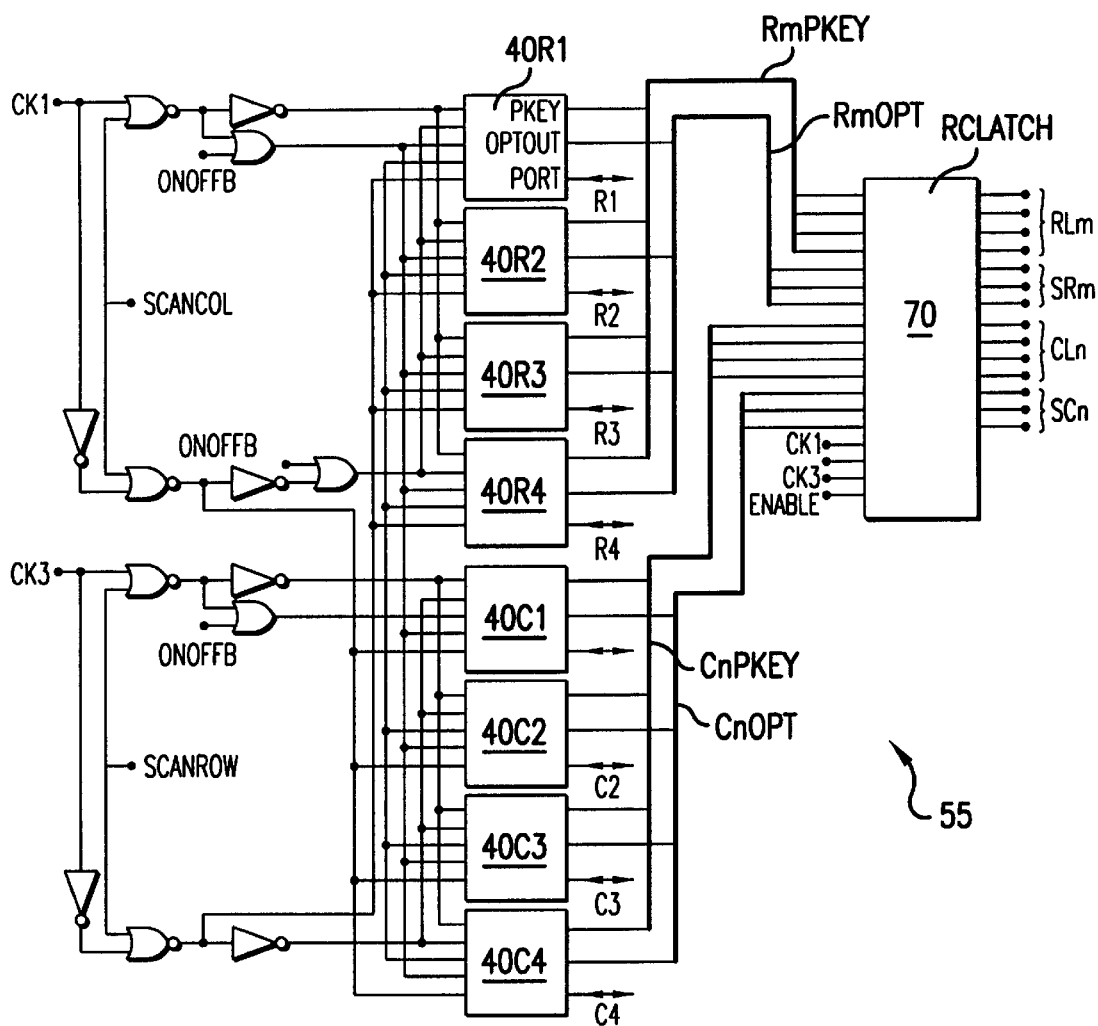
FIG. 6 is a circuit diagram illustrating the connections of the inputs and the outputs of the circuits of FIGS. 4 and 5.
Figure 7:
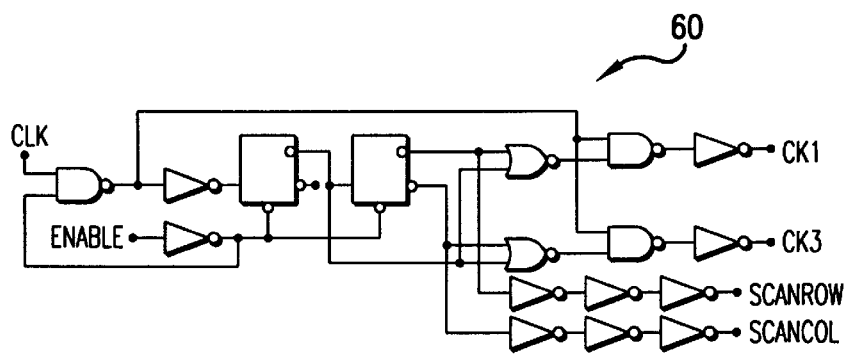
FIG. 7 is a circuit diagram of a pulse generation circuit which controls the circuit of FIG. 6.
Figure 8:
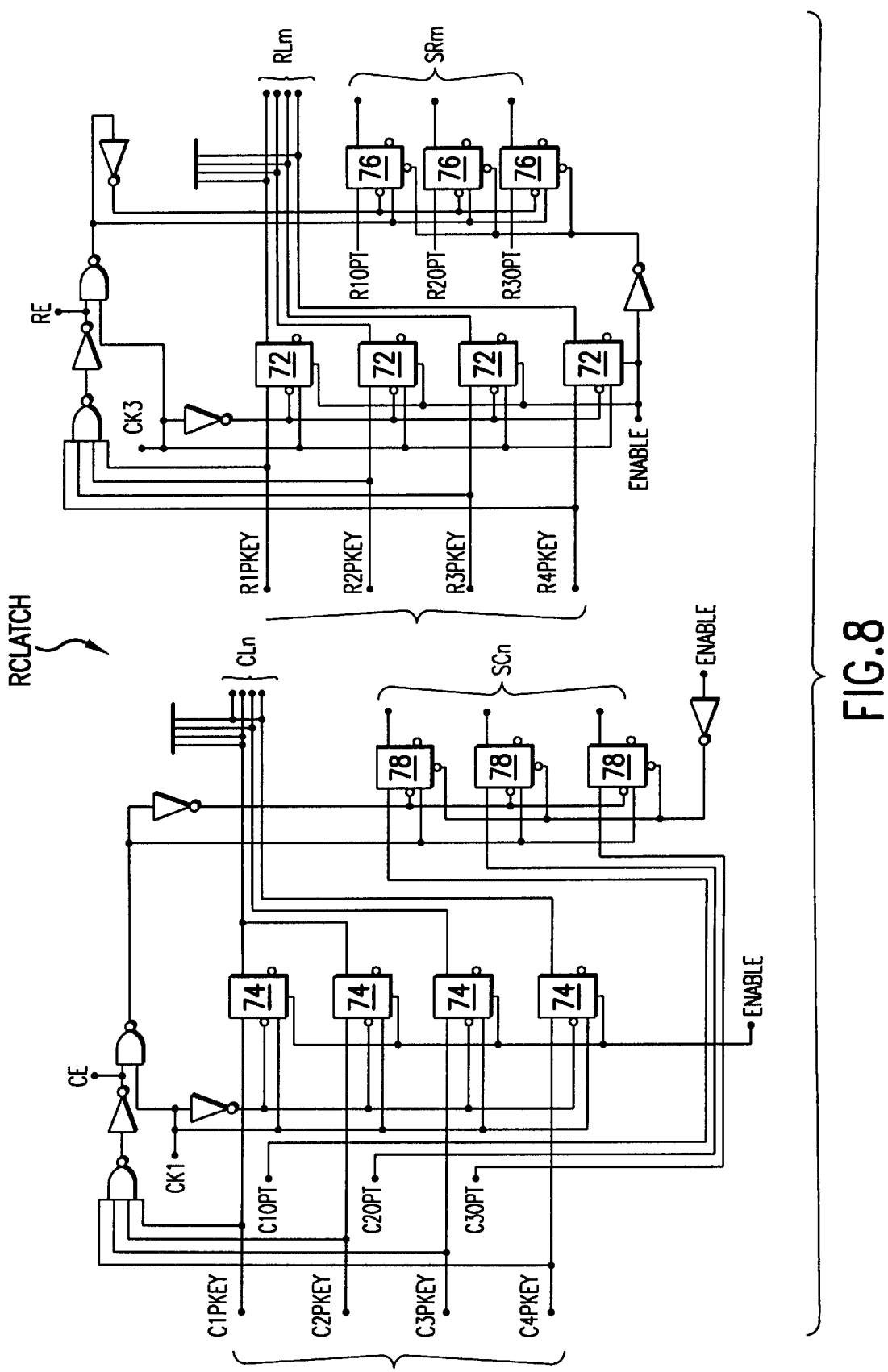
FIG. 8 is a circuit diagram of the RCLATCH of FIG. 6.

FIGS. 2–4 illustrate the basic principles on which the present invention is based, and how they can be embodied in non-limiting exemplary circuits. FIG. 5 then illustrates the input detection circuit of the present invention, embodying the circuits illustrated in FIGS. 2–4, in use with a matrix keypad. FIGS. 6–8 illustrate a non-limiting example of circuits that can be used to process the information generated by the circuits of FIGS. 2–5.

FIG. 2 illustrates a simplified circuit 20 having a first voltage source connected to the positive terminal of a capacitor C via a first switch SW1, and a second voltage source connected to the positive terminal of the capacitor C via a second switch SW2. The negative terminal of the capacitor C is connected to ground via the first switch SW1. A first input/output (I/O) pin, port A, is defined at the positive terminal of the capacitor C, and a second I/O pin, port B, is defined at the negative terminal of the capacitor C.

When in use, each timing frame for the circuit 20 operates in two sequential windows or modes: a bias window or mode, and a scan window or mode. In the bias mode, if the first switch SW1 is closed and the second switch SW2 is opened, then the positive potential VA at port A of the capacitor C is V1 (which is the potential of the first voltage source), the potential VB at port B of the capacitor C is 0 (because it is grounded), and the potential VC of the capacitor C is charged to V1. The circuit 20 now progresses to the scan mode. Now in the scan mode, if the first switch SW1 is now opened and the second switch SW2 closed, then the positive potential VA at port A of the capacitor C is V2 (which is the potential of the second voltage source), the potential VC of the capacitor C is maintained at the potential V1, and the potential VB at port B is V2−V1. Thus, the level of the potential VB at port B, which is the difference in voltage potential, can be used to determine the existing condition of the connection between Port A and Port B. This condition can take the form of one of the following three conditions: (1) OPEN (i.e., the connection between Ports A and B is open); (2) SHORT (i.e., the connection between Ports A and B has been shorted); and (3) the presence of a crossover capacitor between Ports A and B.

FIG. 3 illustrates the principles of FIG. 2 embodied in an actual circuit 30 according to the present invention. The switches SW1 and SW2 in FIG. 2 are implemented in the form of PMOS (P-channel Metal Oxide Semiconductor Field Effect Transistor) and NMOS (N-channel Metal Oxide Semiconductor Field Effect Transistor) whose opening and closing can be controlled by control signals generated by a processor (not shown). The circuit 30 includes a bias section 32 and a scan section 34. The bias section 32 includes two PMOS P1 and P2 having their source ends connected to a voltage source VDD, and their drain ends connected to the drain end of an NMOS N1. The source end of the NMOS N1 is connected to ground. The drain ends of PMOS P1 and P2, and NMOS N1, are connected to Port A, at the positive terminal of capacitor C. The scan section 34 has two NMOS N2 and N3, whose source ends are connected to ground, and whose drain ends are connected to Port B, at the negative terminal of capacitor C. The drain ends of NMOS N2 and N3 are also connected to two phase inverters or NOT gates NOT1 and NOT2 to produce PKEY and OPTOUT output signals, respectively. The gates P1G, P2G, N1G, N2G and N3G are the input ends of the control for P1, P2, N1, N2 and N3, respectively.

Comparing FIGS. 2 and 3, P1G, N1G and N2G in FIG. 3 correspond to the first switch SW1 in FIG. 2, and P2G and N3G in FIG. 3 correspond to the second switch SW2 in FIG. 2. Thus, assuming the condition that a capacitor C is connected between Ports A and B, in the bias mode, if P1G, N1G and N2G (i.e., corresponding to the first switch SW1) are closed and P2G and N3G (i.e., corresponding to the second switch SW2) are opened, then the positive potential VA at port A of the capacitor C is ½VDD, the potential VB at port B of the capacitor C is 0 (because it is grounded via N2G), and the potential VC of the capacitor C is charged to ½VDD. Now in the scan mode, if P1G, N1G and N2G are now opened and P2G and N3G are closed, then the positive potential VA at port A of the capacitor C is VDD, and the potential VB at port B is ½VDD. Table 1 summarizes the voltage potentials at VA and VB during each of the three conditions at the connection (SHORT, open, capacitor present) between Ports A and B:

TABLE 1

| Switch State | SHORT | VA OPEN | CAPACITOR | SHORT | VB OPEN | CAPACITOR |
| --- | --- | --- | --- | --- | --- | --- |
| Bias Window | 1/2VDD | 1/2VDD | 1/2DD | 1/2VDD | 0V | 0V |
| Scan Window | VDD | VDD | VDD | VDD | 0V | 1/2VDD |

The output signal PKEY is used to represent whether a specific key has been pressed. If the key is pressed, PKEY=0. If the key has not been pressed, PKEY=1.

The output signal OPTOUT is used to determine the existing condition of the connection between Port A and Port B only in the case when the key is not pressed. Thus, if the key has been pressed, then OPTOUT is inoperative, although OPTOUT is equal to 0. If the key has not been pressed, OPTOUT=1 if the connection between Ports A and B is OPEN, and OPTOUT=0 if a capacitor is present between Ports A and B. Thus, the following Table 2 summarizes the relationships between PKEY and OPTOUT:

TABLE 2

|        | OPEN | SHORT | CAPACITOR PRESENT |
|--------|------|-------|-------------------|
| PKEY   | 1    | 0     | 1                 |
| OPTOUT | 1    | 0     | 0                 |

To further illustrate the operation principles of FIGS. 2 and 3, let us assume that the mode-shift point of NOT1 is set at $\frac{4}{5}$VDD and the mode-shift point of NOT2 is set at $\frac{1}{5}$VDD. Now assuming that VDD=5V, NOT1's mode-shift point would be set at 4V and NOT2's mode-shift point would be set at 1V. In addition, the voltage potential applied to NOT1 and NOT2 is the same, and they are both equal to VB. Therefore, the following Table 3 illustrates the possible values for PKEY and OPTOUT based on the possible conditions for NOT1 and NOT2 (i.e., VB):

TABLE 3

|                   | VB > 4V (SHORT) | 1V < VB < 4V (CAPACITOR) | VB < 1V (OPEN) |
|-------------------|-----------------|--------------------------|----------------|
| PKEY (via NOT1)   | 0               | 1                        | 1              |
| OPTOUT (via NOT2) | 0               | 0                        | 1              |

As illustrated in Table 3, when the potential VB at Port B is scanned during the scan mode, if VB>4V, then it is determined that the connection between Ports A and B is SHORTed (i.e., the key has been pressed). If VB<1V, then it is determined that the connection between Ports A and B is OPEN. If VB is between 1V and 4V, then it is determined that a capacitor C is connected between Ports A and B. Note that Table 3 is actually Table 2 with the conditions (SHORT, open and capacitor present) represented by the value of VB.

The fact that OPTOUT is programmed in the present invention to be inoperative if there is a SHORT between Ports A and B (i.e., when the key has been pressed) is important. This is because, when there is a SHORT between Ports A and B, there is otherwise no way of determining whether a capacitor C is connected between Ports A and B (see FIGS. 2 and 3). Therefore, the RCLATCH 70 in FIGS. 6 and 7, described in greater detail below, is provided to accurately determine the existence of a SHORT between Ports A and B.

In addition, the circuit 30 of FIG. 3 can be modified so that it can operate as both a bias section 32 circuit and a scan section 34 circuit. FIG. 4 illustrates the resulting combined circuit 40. When the circuit 40 is to be used as a bias section 32 on the side of Port A, N2, N3, NOT1 and NOT2 are not used. When the circuit 40 is to be used as a scan section 34 on the side of Port B, P1, P2 and N1 are not used.

Thus, as illustrated in FIGS. 2–4, the difference in the voltage potential across the terminals of a crossover capacitor C provide the PKEY and OPTOUT signals which are used to determine whether a key has been pressed, and if a key has not been pressed, whether a crossover capacitor is present across a key.

FIG. 5 illustrates how a plurality of the circuits 40 of FIG. 4 are used in connection with a matrix keypad 50 according to the present invention. In FIG. 5, a 4×4 matrix keypad of keys Knm (n for column, m for rows) is provided having four rows R1–R4 and four columns C1–C4, having a first column of keys K11–K14, a second column of keys K21–K24, a third column of keys K31–K34, and a fourth column of keys K41–K44. Cross-over capacitors C according to the present invention are connected across keys K42 and K24. Each key is coupled to and controlled by two circuits 40, with one such circuit 40 operating as the bias section 32 (i.e., Port A) and the other such circuit 40 operating as the scan section 34 (i.e., Port B). In addition, P1G, P2G, N1G, N2G and N3G of each circuit 40 represent the inputs to the circuit 40, with PKEY and OPTOUT representing the outputs of the circuit 40.

The circuit 55 in FIG. 6 illustrates the connections of the inputs and the outputs of the circuits 40 of FIGS. 4 and 5. Some of the inputs to each circuit 40 are provided by a pulse generation circuit 60, which is illustrated in FIG. 7. The PKEY and OPTOUT outputs from each circuit 40 are delivered as inputs to an RCLATCH 70.

The pulse generation circuit 60 receives a system clock CLK signal and an ENABLE signal, and generates CK1 and SCANCOL signals for controlling the scanning of the column circuits 40C1, 40C2, 40C3 and 40C4. The system clock CLK signal and the ENABLE signal are also used by the pulse generation circuit 60 for generating CK3 and SCANROW signals for controlling the scanning of the row circuits 40R1, 40R2, 40R3 and 40R4. The scanning of these circuits 40 is used to determine the PKEY and OPTOUT values for each circuit 40, whose values are then provided to an RC latch 70.

Referring to FIGS. 6 and 7, the signal ONOFFB is used to indicate whether the handset of the telephone has been lifted, and the ENABLE signal is used to initiate the scanning of the keypad in the "scan option" mode of the telephone. When ONOFFB=1 (i.e., when the handset has not been lifted), the potential at all Ports A and B are maintained at a floating level and the telephone is waiting to receive an external call. At this time, since all the first switches SW1 of all the circuits 40 are open (i.e., the NMOS and PMOS are all closed), the circuits 40 are all in a power-saving mode since the lack of a voltage potential across the Ports A and B means that there is no current flow and power dissipation.

Now, when ONOFFB=0 (i.e., the handset has been lifted), the telephone is ready to dial an external telephone number. At this time, if ENABLE=0, the circuit will allow either the scanning of all the keys in the "scan option mode", or the pressing of keys. As explained in greater detail below, if no key is pressed when both ONOFFB and ENABLE are equal to zero, the circuit will initiate the scanning of all the keys in the "scan option" mode in the manner described below. However, if a key is pressed, the "scan option" operation is stopped. In other words, the "key press" overrides the scanning of any options to avoid errors in the situation where a key is pressed at the same time when the options are being scanned during the execution of the "scan option" mode.

If, however, at this time ENABLE=1, it means that the circuits 40 are not scanning the keys for options, but that the circuits 40 are maintained in a stand-by mode. In other words, when ENABLE=1, the outputs RLm and CLn (described below) from the RCLATCH 70 are fixed at high levels, and the outputs SCn and SRm (described below) from the RCLATCH 70 are fixed at low levels, since the inputs RmPKEY, RmOPT, CnPKEY and CnOPT (described below) to the RCLATCH 70 have no effect on the outputs RLm, CLn, SCn and SRm.

The PKEY and OPTOUT outputs (RmPKEY, RmOPT, CnPKEY and CnOPT) from each circuit 40 are delivered as inputs to the RCLATCH 70. The RCLATCH 70 outputs four signals RLm, SRm, CLn and SCn. Referring to FIG. 8, the RCLATCH 70 actually latches (via flip-flops 72) the input PKEY signals RmPKEY from the row circuits 40R1, 40R2, 40R3 and 40R4 and outputs these signals as RLm signals. Similarly, the RCLATCH 70 latches (via flip-flops 74) the input PKEY signals CnPKEY from the column circuits 40C1, 40C2, 40C3 and 40C4 and outputs these signals as CLn signals. The input OPTOUT signals RmOPT from the first three row circuits 40R1, 40R2 and 40R3 are latched (via flip-flops 76) and output as the SRm signals if the value of RLm is "1111", as explained below. Similarly, the input OPTOUT CnOPT signals from the first three column circuits 40C1, 40C2 and 40C3 are latched (via flip-flops 78) and output as the SCn signals if the value of CLn is "1111", as explained below. The latches in FIG. 8 are provided in the form of D-type flip-flops 72, 74, 76, 78, although other types of conventional latching mechanisms can also be used.

The RLm and CLn signals indicate whether a key has been pressed. If no key has been pressed, then both RLm and CLn will always be "1111". However, if a key has been pressed, then the values of RLm and CLn will be one of the values set forth in the table of FIG. 10, depending on the particular key that has been pressed. For example, if key K34 has been pressed, then RLm will be "1110" and CLn will be "1101". The principle that is used in determining the values of RLm and CLn set forth in FIG. 10 is that a "0" represents the row or column on which the pressed key occurs. Therefore, pressing key K34 means that the key at column 3, row 4 has been pressed, so the third bit of the CLn value is "0", and the fourth bit of the RLm value is "0". Similarly, pressing key K11 means that the first key at both the columns and the rows has been pressed, so the values of RLm and CLn are the same: "0111".

If the values of both CLn and RLm are "1111" (i.e., no key has been pressed), then the CK1 and CK3 clocks, respectively, and the CE and RE signals (which will have a value of "1"), respectively, will together cause the outputs of SCn and SRm to be delivered to the processor. The output of SCn and SRm (i.e., the OPTOUT values) will indicate the keys where crossover capacitors C have been connected, and the processor will use this information in determining and implementing the appropriate scan option selected. However, if either the value of CLn or RLm is not equal to "1111" (i.e., a key has been pressed), then the RE and CE signals will be equal to "0", which will disable the flip-flops 76 and 78, respectively, so that SCn and SRm have no output. This mechanism allows the present invention to avoid errors in the situation where a key is pressed at the same time when the options are being scanned during the execution of the "scan option" mode of the telephone. In such situations, the "key press" overrides the scanning of any options.

Figure 9:
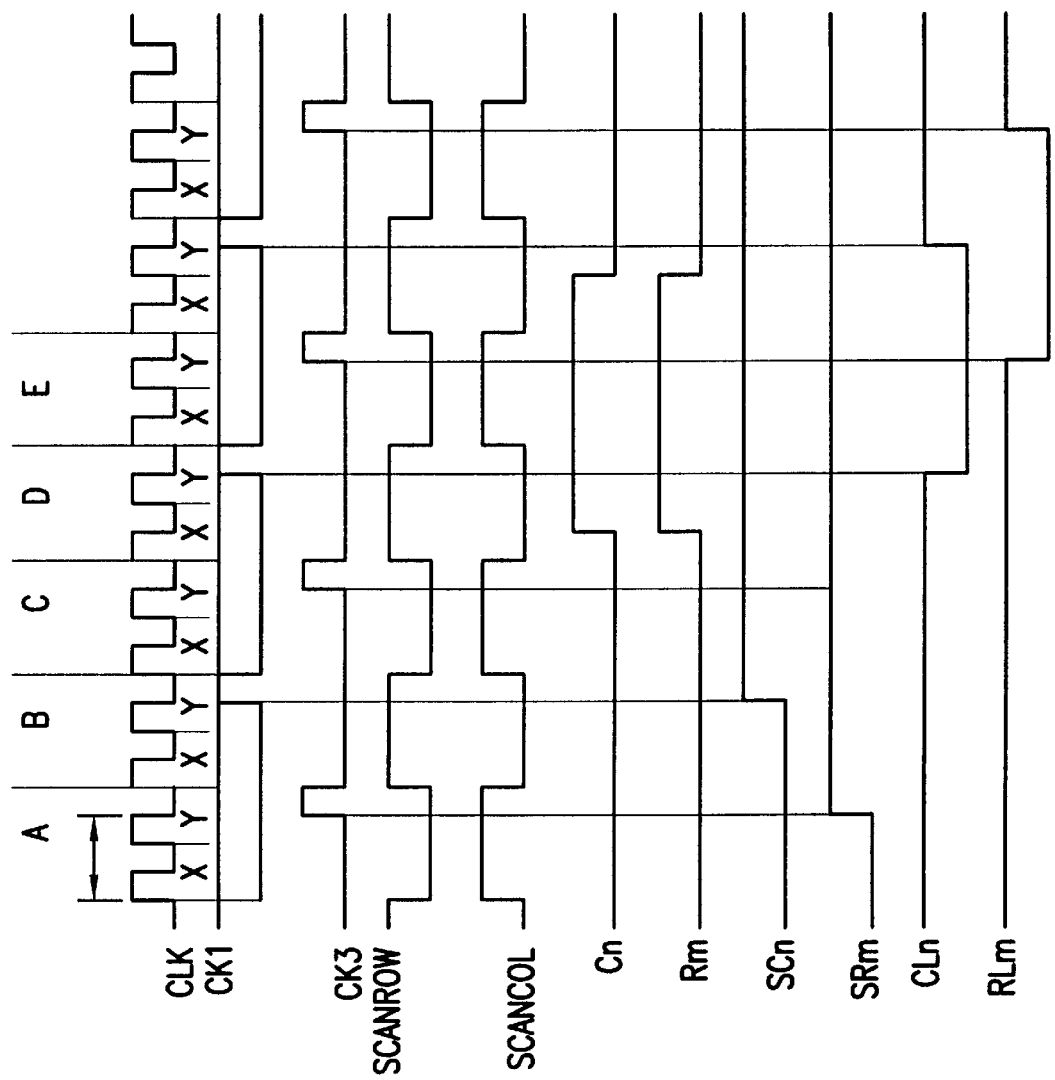
FIG. 9 is a timing diagram for the circuit of FIG. 6.

The operation of the matrix keypad 50 of FIG. 5 will now be described in connection with FIGS. 5, 6, 8 and 9. In FIG. 9, each phase "X" represented by a clock signal CLK is the bias mode, while each phase "Y" represented by a clock signal CLK is the scan mode. When the user picks up the handset, the keypad 50 is scanned by the processor during the execution of the "scan option" mode of the telephone. At this time, both RLm and CLn have the value "1111".

The processor first scans for the PKEY and OPTOUT outputs from the row circuits 40R1–40R4. To do so, the column circuits 40C1–40C4 will act as bias section 32 circuits, and the row circuits 40R1–40R4 will act as scan section 34 circuits. As shown in FIG. 9, the scanning of the row occurs when SCANROW becomes low. At this time, the processor causes the connection at keys K41–K44, for example, along a column to simultaneously enter the bias mode. Since the connections at keys K41, K43 and K44 are OPEN, and a crossover capacitor is present at key K42, the voltage potential VA at Port A of column circuits 40C1–40C4 is 2.5V or ½VDD (again assuming that VDD= 5V), and the voltage potential VB at Port B of row circuits 40R1–40R4 is 0V. When the connections at keys K41–K44 then enter the scan mode, the voltage potential VA at Port A of column circuits 40C1–40C4 is 5V or VDD, and the voltage potential VB at Port B of row circuits 40R1, 40R3 and 40R4 remains at 0V. However, since a crossover capacitor C is present at key K42, the voltage potential VB at Port B of circuit 40R2 becomes 2.5V or ½VDD. These results are illustrated in Table 1 above. For row circuits 40R1, 40R3 and 40R4, since VB<1V (since VB=0V), PKEY=1 (i.e., key is not pressed) and OPTOUT=1 (i.e., connection is OPEN). For row circuit 40R2, since 1V<VB<4V (since VB=2.5V), PKEY=1 (i.e., key is not pressed) and OPTOUT=0 (i.e., capacitor present). See Table 3 above. Thus, RLm outputs the value "1111" and SRm outputs the value "101" (i.e., the OPTOUT values at 40R1, 40R2 and 40R3 are "101" in that order). Referring to FIG. 9, the falling edge of the clock signal CLK for the scan mode causes CK3 to go high, which causes the value of SRm to be output.

The processor now scans for the PKEY and OPTOUT outputs from the column circuits 40C1–40C4. To do so, the row circuits 40R1–40R4 will act as bias section 32 circuits, and the column circuits 40C1–40C4 will act as scan section 34 circuits. As shown in FIG. 9, the scanning of the column occurs when SCANCOL becomes low. At this time, the processor causes the connection at keys K11–K41, for example, along a row to simultaneously enter the bias mode. Since the connections at keys K11–K41 are all OPEN, voltage potential VA at Port A of row circuits 40R1–40R4 is 2.5V or ½VDD (again assuming that VDD=5V), and the voltage potential VB at Port B of column circuits 40C1–40C4 is 0V. When the connections at keys K11–K14 then enter the scan mode, the voltage potential VA at Port A of row circuits 40R1–40R4 is 5V, and the voltage potential VB at Port B of column circuits 40C1–40C4 remains at 0V. These results are also illustrated in Table 1 above. Since VB<1V (since VB=0V), PKEY=1 (i.e., key is not pressed) and OPTOUT=1 (i.e., connection is OPEN). See Table 3 above. Thus, CLn outputs the value "1111" and SCn outputs the value "111". Referring to FIG. 9, the falling edge of the clock signal CLK for the scan mode causes CK1 to go high, which causes the value of SCn to be output.

As explained in connection with FIGS. 6 and 8 above, the outputs of CLn, Rlm, SCn and SRm (which represent the PKEY and OPTOUT values) are then transmitted to the RCLATCH 70 and processed to determine the option represented by the specific capacitor connection at key K42. These options can include: (1) the blockage of calls made outside a certain area code, (2) operation of the telephone in a pulse dial mode, and (3) the requirement to dial a "9" to get an outside line, among others.

The above-described process is continued by alternatively scanning the other rows and columns in the manner described above, until the entire keypad matrix 50 has been scanned. The order in which the rows and columns are scanned is not critical. At the end of the scan, another capacitor connection will be detected at key K24, and the outputs of PKEY and OPTOUT at K24 are also transmitted to the RCLATCH 70 and to the processor to determine the option represented by the specific capacitor connection at key K24. After the entire keypad matrix has been scanned, the telephone enters the "press key" mode in which it waits for the user to press certain keys, which represent the telephone number to be dialed. Specifically, the keypad matrix is scanned to see if any keys (representing dialed digits) are pressed. If during the scanning of the keypad matrix 50, a key is pressed (i.e., if either the value of CLn or RLm is not equal to "1111"), then the RE and CE signals in FIG. 8 will be equal to "0", which will disable the flip-flops 76 and 78, respectively, so that SCn and SRm have no output, as explained above. After a key has been pressed, the processor switches back to the "scan option" mode to scan the keypad matrix for the capacitor connections after the pressed key has been released, but before the next key is pressed.

The present invention can be modified to allow the user to select or disable certain options when the telephone is in the "press key" mode. For example, referring back to FIG. 5, a capacitor connection can be provided at key K12, with a switch 88 also provided at this connection. When the switch 88 is closed, the capacitor connection at key K12 will also be detected when the options are being scanned in the "scan option" mode. Conversely, when the switch 88 is opened, the capacitor connection at key K12 cannot be detected when the options are being scanned in the "scan option" mode. The switch 88 can be embodied in the form of a mechanical switch provided on the side of the housing of the telephone. Thus, as an example, the capacitor connection at key K12 may be used to represent operation of the telephone in pulse dial mode. During initial operation of the telephone, the switch 88 may be initially opened, so that the capacitor connection at key K12 (and its representative option) is not detected when the options are being initially scanned in the "scan option" mode. After the user dials one telephone number, the user may then desire to dial the next telephone number in pulse dial mode. As a result, the user closes the switch 88, so that when the options are now scanned, the capacitor connection at key K12 (and its representative option) will be detected when the options are next scanned in the "scan option" mode. If the user later desires to disable this option, the switch 88 can be opened again so that the capacitor connection at key K12 (and its representative option) is not detected when the options are next scanned in the "scan option" mode.

Thus, the circuits 55, 60 and 70 are provided to process, according to the principles and requirements described above, the information carried by the PKEY and OPTOUT signals from the circuits 40. Although specific circuits have been illustrated in FIGS. 6–8, it is also possible to provide other circuit configurations that perform the same functions.

Since each key is preprogrammed to represent a specific option if it contains a capacitor connection, each specific telephone keypad can be preprogrammed with different options by providing capacitor connections at the desired keys. Thus, although FIG. 5 illustrates capacitor connections at only keys K12, K42 and K24, it is possible to provide capacitor connections at any key to set up the desired options for this particular telephone.

In addition, although the present invention is illustrated in connection with telephone keypad matrices, it is not so limited but can also be implemented with other matrix input detection circuits, such as for keyboards, electones or electrical numbering locks.

Thus, the input detection circuit and matrix keypad of the present invention provide several advantages not realized by conventional telephone keypads and their circuits. By using crossover capacitors, the telephone can scan for options at any time, even when the telephone is waiting for the user to press a key. In addition, the RC latch 70 and the logic of the PKEY and OPTOUT signals allow the input detection circuit of the present invention to exclude all other options when a key has been pressed, thereby avoiding errors. A further benefit is realized in that power is conserved by providing all the first switches SW1 of all the circuits 40 to be open in a power-saving mode when the no keys are pressed, or when no scanning (i.e., in the bias mode and in the scan mode) takes place.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. An input detection circuit for a keypad, comprising:
   a matrix of keys formed by the intersection of a plurality of rows and a plurality of columns;
   a capacitor connected across the intersecting row and column of at least one of the keys;
   means for generating a difference in voltage potential across the capacitor when the keys are inactive;
   means responsive to the difference in voltage potential across the capacitor for generating a signal representative of the presence of the capacitor.

2. The circuit of claim 1, wherein the signal that is representative of the presence of the capacitor further represents a programmable option.

3. The circuit of claim 1, wherein the capacitor has a positive terminal and a negative terminal, and wherein the means for generating a difference in voltage potential across the capacitor includes:
   a first switch coupled to the positive and negative terminals;
   a first voltage source coupled to the positive terminal via the first switch;
   a second switch coupled to the positive terminal;
   a second voltage source coupled to the positive terminal via the second switch; and
   wherein the negative terminal is coupled to ground via the first switch.

4. The circuit of claim 3, wherein the first switch is closed and the second switch opened, and then the first switch is opened and the second switch closed, to generate a difference in voltage potential at the negative terminal of the capacitor.

5. The circuit of claim 1, wherein the capacitor has a positive terminal and a negative terminal, and wherein the means for generating a difference in voltage potential across the capacitor includes:
   a bias section circuit coupled to the positive terminal; and
   a scan section circuit coupled to the negative terminal.

6. The circuit of claim 5, wherein the bias section circuit includes:
   a first switch coupled to the positive terminal;
   a first voltage source coupled to the positive terminal via the first switch;
   a second switch coupled to the positive terminal; and
   a second voltage source coupled to the positive terminal via the second switch.

7. The circuit of claim 5, wherein the scan section circuit includes:
   a first switch coupled to the negative terminal, the negative terminal coupled to ground via the first switch;
   a first output indicative of whether a key has been pressed; and
   a second output which is the signal representative of the presence of the capacitor.

8. The circuit of claim 7, wherein the means for generating a signal representative of the presence of the capacitor includes the scan section circuit.

9. The circuit of claim 8, wherein the means for generating a signal representative of the presence of the capacitor further includes a latch coupled to the first and second outputs.

10. The circuit of claim 9, wherein the latch prevents the transmission of the second output if the first output received by the latch indicates that a key has been pressed.

11. The circuit of claim 6, wherein:
   the first switch includes a first PMOS having a source end and a drain end, an NMOS having a source end and a drain end, and a voltage source; and
   the second switch includes a second PMOS having a source end and a drain end;
   wherein the drain ends of the first and second PMOS are coupled to the drain end of the NMOS, the source ends of the first and second PMOS are coupled to the voltage source, and the source end of the NMOS is coupled to ground.

12. The circuit of claim 7, wherein the first switch includes a PMOS having a source end and a drain end, the source end coupled to ground, and the drain end coupled to the negative terminal, the first output and the second output.

13. The circuit of claim 1, further including a switch coupled to the capacitor between the intersecting row and column.

14. An input detection circuit for a keypad, comprising:
   a matrix of keys formed by the intersection of a plurality of rows and a plurality of columns, each key having a connection defining a first port and a second port that is connected to either a row or a column respectively;
   a plurality of bias section circuits, each bias section circuit coupled to the first port of a different key;
   a plurality of scan section circuits, each scan section circuit coupled to the second port of a different key; and
   at least one capacitor connected across the first and the second ports of at least one of the keys wherein the bias section circuits and the scan section circuits are operative to determine the presence of the capacitor when the keys are inactive.

15. The circuit of claim 14, wherein each bias section circuit includes:
   a first switch coupled to the first port of a key;
   a first voltage source coupled to the first port of the same key via the first switch;
   a second switch coupled to the first port of the same key; and
   a second voltage source coupled to the first port of the same key via the second switch.

16. The circuit of claim 15, wherein the scan section circuit includes:
   a third switch coupled to the second port of the same key, the second port of the same key coupled to ground via the third switch;
   a first output indicative of whether the same key has been pressed; and
   a second output indicative of whether a capacitor is connected across the first and second ports of the same key.

17. The circuit of claim 16, further including a latch coupled to the first and second outputs.

18. The circuit of claim 17, wherein the latch prevents the transmission of the second output if the first output received by the latch indicates that the key has been pressed.

19. The circuit of claim 14, further including a switch coupled to the capacitor across the first and second ports of the key.

20. A circuit for generating a difference in voltage potential across a capacitor, comprising:
   a capacitor having a positive terminal and a negative terminal;
   a first switch coupled to the positive and the negative terminals;
   a first voltage source selectively coupled to the positive terminal via the first switch and a ground potential selectively coupled to the negative terminal via the first switch;
   a second switch coupled to the positive terminal;
   a second voltage source selectively coupled to the positive terminal via the second switch.

21. A method of detecting a pre-programmed option in a matrix keypad, comprising the steps of:
   a. providing a matrix of keys formed by the intersection of a plurality of rows and a plurality of columns, each key having a connection defining a first port and a second port wherein each port is connected to either one row or one column;
   b. connecting a capacitor across the first and second port of a first key;
   c. generating a difference in voltage potential across the first and second ports of the first key when the keys are inactive; and
   d. detecting a signal representative of the presence of the capacitor based on the difference in voltage potential across the first and second ports of the first key.

22. The method of claim 21, wherein the capacitor has a positive terminal and a negative terminal, and wherein step (c) further includes the steps of:
   c1. providing a circuit having:
      a first switch coupled to the positive and negative terminals;
      a first voltage source coupled to the positive terminal via the first switch;
      a second switch coupled to the positive terminal;
      a second voltage source coupled to the positive terminal via the second switch; and
      wherein the negative terminal is coupled to ground via the first switch
   c2. closing the first switch and opening the second switch; and
   c3. opening the first switch is opened and closing the second switch.

23. The method of claim 21, wherein step (d) includes the steps of:
   d1. generating a first output indicative of whether a key has been pressed; and
   d2. generating a second output which is the signal representative of the presence of the capacitor.

24. The method of claim 23, further including the step of preventing the transmission of the second output if the first output indicates that a key has been pressed.

25. The method of claim 21, wherein step (b) further includes the steps of:

b1. providing a switch at the capacitor across the first and second port of a first key; and b2. closing the switch.

* * * * *